United States Patent
Gopalraja et al.

(10) Patent No.: US 11,315,943 B2
(45) Date of Patent: Apr. 26, 2022

(54) BOTTOM-UP APPROACH TO HIGH ASPECT RATIO HOLE FORMATION IN 3D MEMORY STRUCTURES

(71) Applicant: Applied Materials, Inc., Santa Clara, CA (US)

(72) Inventors: Praburam Gopalraja, Santa Clara, CA (US); Susmit Singha Roy, Sunnyvale, CA (US); Abhijit Basu Mallick, Palo Alto, CA (US); Srinivas Gandikota, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 75 days.

(21) Appl. No.: 16/643,965

(22) PCT Filed: Aug. 28, 2018

(86) PCT No.: PCT/US2018/048342
§ 371 (c)(1),
(2) Date: Mar. 3, 2020

(87) PCT Pub. No.: WO2019/050714
PCT Pub. Date: Mar. 14, 2019

(65) Prior Publication Data
US 2021/0050365 A1     Feb. 18, 2021

Related U.S. Application Data (60) Provisional application No. 62/554,528, filed on Sep. 5, 2017.

(51) Int. Cl.
*H01L 21/768*    (2006.01)
*H01L 27/11582*  (2017.01)
*H01L 27/11556*  (2017.01)

(52) U.S. Cl.
CPC .. *H01L 27/11582* (2013.01); *H01L 21/76877* (2013.01); *H01L 21/76883* (2013.01); *H01L 27/11556* (2013.01)

(58) Field of Classification Search
CPC ......... H01L 27/11582; H01L 27/11556; H01L 27/0688; H01L 21/76877; H01L 21/283; H01L 21/76883
See application file for complete search history.

(56) References Cited

U.S. PATENT DOCUMENTS 6,576,113 B1   6/2003  Scherer et al.
8,575,753 B2   11/2013  Choi et al.
(Continued)

FOREIGN PATENT DOCUMENTS

JP    2008283045 A    11/2008
TW    200707658 A    12/2007

OTHER PUBLICATIONS

PCT International Search Report and Written Opinion in PCT/US2018/048342 dated Dec. 14, 2018, 9 pages.

*Primary Examiner* — Sarah K Salerno
(74) *Attorney, Agent, or Firm* — Servilla Whitney LLC (57) ABSTRACT

Methods of forming memory structures are described. A metal film is deposited in the features of a structured substrate and volumetrically expanded to form pillars. A blanket film is deposited to a height less than the height of the pillars and the blanket film is removed from the top of the pillars. The height of the pillars is reduced so that the top of the pillars are below the surface of the blanket film and the process is optionally repeated to form a structure of predetermined height. The pillars can be removed from the features after formation of the predetermined height structure to form high aspect ratio features.

20 Claims, 6 Drawing Sheets

(56) References Cited

U.S. PATENT DOCUMENTS

| | | |
|---|---|---|
| 9,359,195 B2 | 6/2016 | Mardilovich et al. |
| 9,449,821 B2 | 9/2016 | Yang et al. |
| 10,083,834 B2 | 9/2018 | Thompson et al. |
| 10,319,636 B2 | 6/2019 | Basu et al. |
| 2007/0199922 A1 | 8/2007 | Shen et al. |
| 2010/0173494 A1 | 7/2010 | Kobrin |
| 2010/0330805 A1 | 12/2010 | Doan et al. |
| 2012/0298947 A1* | 11/2012 | Clark .................. H01L 45/1675 257/2 |
| 2016/0286749 A1* | 10/2016 | Garcia Rojas ......... A01H 4/005 |
| 2017/0076945 A1 | 3/2017 | Hudson |
| 2018/0096847 A1 | 4/2018 | Thompson et al. |
| 2018/0130657 A1* | 5/2018 | Duan ................ H01L 21/76897 |
| 2018/0144980 A1 | 5/2018 | Basu et al. |

\* cited by examiner

FIG. 2 though, for the disclosure many admit to other equally effective embodiments.

BOTTOM-UP APPROACH TO HIGH ASPECT RATIO HOLE FORMATION IN 3D MEMORY STRUCTURES

CROSS-REFERENCE TO RELATED APPLICATIONS

This application is the National Stage entry of PCT/US2018/048342, filed on Aug. 28, 2018, which claims priority to U.S. Provisional Application Ser. No. 62/554,528, filed Sep. 5, 2017, the entire disclosures of which are hereby incorporated by reference herein.

FIELD

Embodiments of the disclosure generally relate to methods for forming high aspect ratio features. In particular, embodiments of the disclosure generally related to bottom-up methods of forming high aspect ratio holes or trenches for 3D memory structures.

BACKGROUND

Reliably producing sub-half micron and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI technology have placed additional demands on processing capabilities. Reliable formation of structures on the substrate is important to VLSI and ULSI success and to the continued effort to increase circuit density and quality of individual substrates and die.

In order to enable the fabrication of next generation devices and structures, three dimensional (3D) stacking of features in semiconductor chips is often utilized. In particular, fin field effect transistors (FinFET) are often utilized to form three dimensional (3D) structures in semiconductor chips. By arranging transistors in three dimensions instead of conventional two dimensions, multiple transistors may be placed in the integrated circuits (ICs) very close to each other.

Forming high aspect ratio (HAR) structures is typically accomplished by various etching processes. As the aspect ratio of the structures being formed increases, there is a greater tendency to form non-uniformly shaped structures.

Therefore, there is a need in the art for methods of forming high aspect ratio structures with improved uniformity.

SUMMARY

One or more embodiments of the disclosure are directed to methods of forming memory structures. A metal film is deposited in the features of a structured substrate. The structured substrate comprises a plurality of features that extend into the substrate a depth from a surface of the substrate. The metal film is volumetrically expanded to form a pillar that extends straight out of the feature. A blanket film is deposited to a thickness less than a height of the pillars. The blanket film forms on the top of the pillars. The blanket film is removed from the top of the pillars. The height of the pillars is reduced to be lower than the thickness of the blanket film so that the plurality of features is at least partially reformed. Depositing the metal film, forming pillars, depositing the blanket film, removing the blanket film from the top of the pillars and reducing the height of the pillars are optionally repeated to grow a structure of a predetermined height. All of the pillars are removed from the features of the structured substrate.

Additional embodiments of the disclosure are directed to methods of forming memory structures. A structured substrate having a surface with a plurality of features formed therein is provided. The features extend a depth from the surface of the substrate. A conformal metal film is deposited in the features of the structured substrate and form an overburden on the surface of the structured substrate. The overburden is removed from the surface of the substrate so that the metal film remains substantially only within the features. The metal film in the features of the substrate is oxidized to form pillars that extend straight out of the features. The pillars have a height and a top. A blanket film comprising alternating oxide layers and nitride layers is deposited. The blanket film is deposited to a thickness less than the height of the pillars. The blanket film forms on a top of the pillars. The blanket film is removed from the top of the pillars. The height of the pillars is reduced to be lower than the thickness of the blanket film so that the top of the pillar is below the surface of the blanket film and at least partially reform the features. Depositing the metal film, forming pillars, depositing the blanket film, removing the blanket film from the top of the pillars and reducing the height of the pillars are optionally repeated to grow a structure of a predetermined height. All of the pillars are removed from the features of the structured substrate.

Further embodiments of the disclosure are directed to methods of forming memory structures. The methods comprise: (a) providing a structured substrate having a surface with a plurality of features formed therein, the features extending a depth from the surface of the substrate; (b) depositing a conformal metal film in the features of the structured substrate and forming an overburden on the surface of the structured substrate; (c) removing the overburden from the surface of the substrate so that the metal film remains substantially only within the features; (d) oxidizing the method metal film in the features of the substrate to form pillars that extends straight out of the features, the pillars having a height and a top; (e) depositing a blanket film comprising alternating oxide layers and nitride layers, the blanket film deposited to a thickness less than the height of the pillars, the blanket film forming on a top of the pillars; (f) removing the blanket film from the top of the pillars; (g) reducing the height of the pillars to be lower than the thickness of the blanket film so that the top of the pillar is below the surface of the blanket film and at least partially reforming the features; (h) optionally repeating (b) through (g) to grow a structure of a predetermined height; and (i) removing all of the pillars from the features of the structured substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

Embodiments of the disclosure advantageously provide methods of forming high aspect ratio (HAR) holes in 3D memory structures using progressive bottom up column/pillar growth. Some embodiments advantageously provide methods of forming HAR features that uniformly shaped. Some embodiments advantageously provide methods of forming HAR features using pillar growth and selective etching processes. In some embodiments, tungsten is deposited on the structure of holes or trenches in a substrate and volumetrically expanded (e.g., by oxidation) to form pillars that grow out of the holes or trenches. The pillars are bottom-up pillars, selectively grown from suitable metals (e.g., tungsten). The pillars can be selectively removed by specific chemistry (e.g., $WCl_5$, $WCl_6$).

Figure 1A:
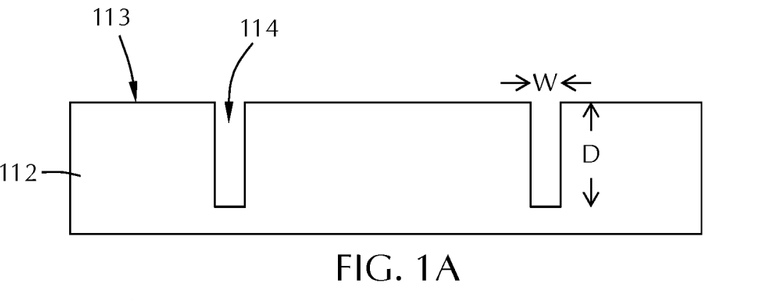
FIGS. 1A through 1M shows a partial cross-sectional schematic of a process in accordance with one or more embodiments of the disclosure.

FIGS. 1A through 1M illustrate a cross-sectional view of an electronic device structure during formation of high aspect ratio features in accordance with one or more embodiment of the disclosure. FIG. 2 illustrates an exemplary process flow for the formation of the high aspect ratio features illustrated in FIGS. 1A through 1M.

Method 100 begins with process 110 in which a structured substrate 112 is provided for processing. As used in this regard, the term "provided" means that the substrate is placed into a position or environment for further processing. As shown in FIG. 1A, the substrate 112 has a surface 113 and includes at least one feature 114. The embodiment illustrated in the Figures shows two features 114; however, those skilled in the art will understand that there can be more or less than two features. The shape of the features 114 can be any suitable shape including, but not limited to, trenches and cylindrical vias. In some embodiments, the feature 114 is a hole or via. As used in this regard, the term "feature" means any intentional surface irregularity. Features 114 can have any suitable aspect ratio (ratio of the depth of the feature to the width of the feature) and will serve as a basis for formation of pillars which are used for alignment of the high aspect ratio hole formation process.

The at least one feature 114 forms an opening in the top surface 113 of the substrate 112. The feature 114 extends from the top surface 113 to a depth D to a bottom surface. The feature 114 has a first sidewall and a second sidewall that define a width W of the feature 114. The open area formed by the sidewalls and bottom are also referred to as a gap.

Figure 1B:
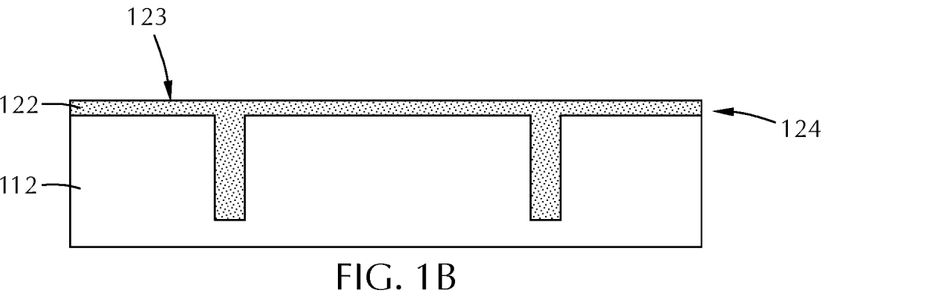
Figure 1C:
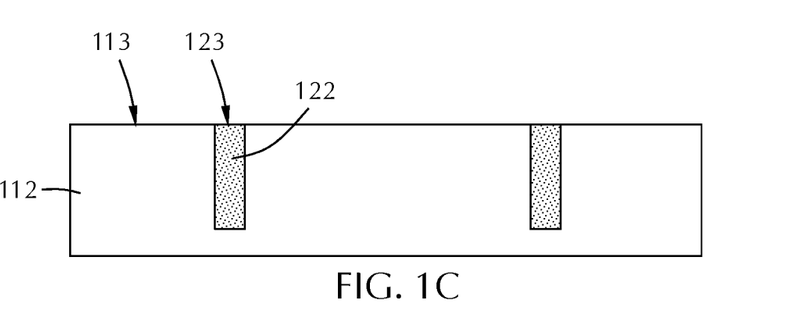
Figure 2:
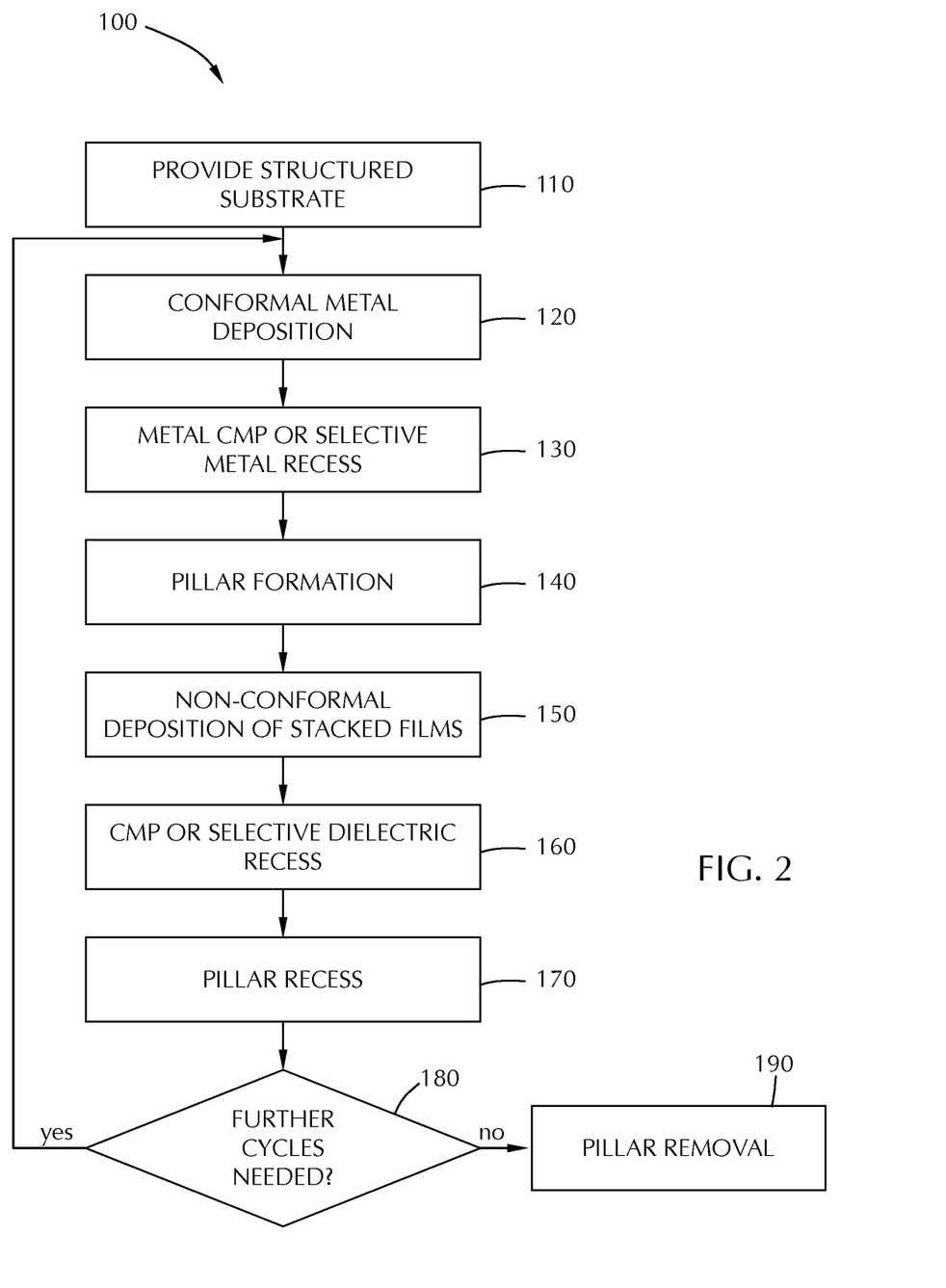
FIG. 2 shows a process sequence in accordance with one or more embodiment of the disclosure.

As illustrated in FIGS. 1B and 1C, at procedures 120 and 130, a metal film 122 is formed or deposited in the features 114 of the structured substrate 112. The metal film 122 can formed so that the top 123 of the metal film 122 is coplanar with or below the surface 113 of the substrate 112, as illustrated in FIG. 1C. In the embodiment illustrated, the formation of the metal film 122 in the features 114 includes deposition and overburden removal procedures, as shown in FIGS. 1B and 1C, respectively. Those skilled in the art will understand that the process can be a single procedure that does not form an overburden so that deposition within the features 114 occurs.

At procedure 120, shown in FIG. 1B, the metal film 122 is deposited within the features 114 and on the surface 113 of the substrate 112 so that an overburden 124 is formed. The overburden is defined as the portion of the film that forms outside of the features 114 on the surface 113.

Deposition of the metal film 122 can be done by any suitable technique or process known to the skilled artisan. In some embodiments, a conformal metal film 122 is deposited so that the feature 114 is filled with little or no seam and an overburden 124 is formed. As used herein, the term "conformal", or "conformally", refers to a layer that adheres to and uniformly covers exposed surfaces with a thickness having a variation of less than 1% relative to the average thickness of the film. For example, a 1,000 A thick film would have less than 10 A variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces. In some embodiments, the metal film 122 is formed by an atomic layer deposition (ALD) process.

The metal film 122 can include any suitable metal that can be volumetrically expanded by a subsequent electrochemically oxidizing process. Suitable metals include, but are not limited to metals having a Pilling-Bedworth ratio greater than 2, greater than 2.25, or greater than 2.5. Pilling-Bedworth ratio refers to a ratio of a volume of the elementary cell of a metal oxide to the volume of the elementary cell of the corresponding metal from which the oxide is formed. The Pilling-Bedworth ratio is defined as the $V_{oxide}/$ $V_{metal}$, where V is volume. For determining the Pilling-Bedworth ratio of a metal oxide, $V_{oxide}$ equals the molecular mass of the of the metal oxide multiplied by the density of the metal, and $V_{metal}$ equals the number of atoms of metal per one molecule of the oxide multiplied by the atomic mass of the metal multiplied by the density of the oxide. Examples of such films include one or more of Co, Mo, W, Ta, Ti, Ru, Rh, Cu, Fe, Mn, V, Nb, Hf, Zr, Y, Al, Sn, Cr, Os, U and/or La. In some embodiments, the metal has a Pilling-Bedworth ratio of greater than 2, greater than 2.25, or greater than 2.5. In some embodiments, the metal is selected from the group consisting of Mo, Os, and V. In some specific embodiments, the metal comprises tungsten. In some specific embodiments, the metal consists essentially of tungsten. As used in this manner, the term "consists essentially of tungsten" means that the bulk metal film (i.e., not including interface regions adjacent the substrate or surface of the film) is greater than or equal to about 95%, 98% or 99% tungsten on an atomic basis.

At procedure 130, after formation of the metal film 122 including overburden 124, the metal film 122 is removed from the substrate surface 113. Stated differently, the overburden 124 of the metal film 122 is removed from the substrate surface 113. As illustrated in FIG. 1C, after removal of the overburden 124, the substrate surface 113 and the top 123 of the metal film 122 are exposed. The metal film 122 is removed from the top surface 113 such that it is contained entirely within the feature 114. The metal film 122 can be removed by any suitable etch process. In some embodiments, the metal film 122 is removed by a chemical-mechanical planarization (CMP) process.

In some embodiments, substantially all of the metal film 122 is formed within the feature 114. As used in this regard, the term "substantially all" means that greater than or equal to about 95%, 98% or 99% of the film is formed within the feature 114 on a weight basis.

In some embodiments, the metal film 122 is selectively deposited within the feature 114 and is not deposited on the top surface 113 of the substrate 112. In these embodiments, the substrate 122 would be processed such that it would flow from FIG. 1A to FIG. 1C without appearing like FIG. 1B. In some embodiments, the method includes selectively depositing a metal film 122 within the trench to a height H less than or equal to the depth D of the feature 114. In one embodiment, the metal film 122 fills at least 10% of the volume of the trench. In other embodiments, the metal film 122 fills at least 15%, 20%, 25%, 30%, 35%, 40%, 45%, 50%, 55%, 60%, 65%, 70%, 75%, 80%, 85%, 90%, 95% or 100% of the volume of the trench. In some embodiments, the metal film 122 deposited in the feature 114 has a height that is less than or equal to about 98%, 95%, 90%, 80%, 70%, 60% or 50% of the depth of the feature 114.

Figure 1D:
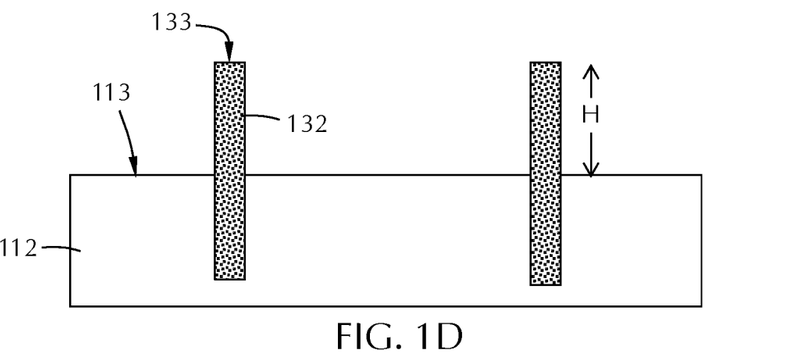

At procedure 140, metal film 122 is volumetrically expanded to form pillars 132, as shown in FIG. 1D. The pillars 132 can be formed by treating the metal film 122 within the features 114 to expand the film material volume to create pillars 132. The pillars 132 extend beyond the top surface 113 of the substrate 112.

The expansion of the metal film 122 can be in the range of about 10% to about 1000%, or in the range of about 50% to about 800%, or in the range of about 100% to about 700%. In some embodiments, the metal film 122 expands by an amount greater than or equal to about 150%, 200%, 250%, 300% or 350%. In one or more embodiments, treating the film results in the film volume increasing by at least 10%, 20%, 30%, 40%, 50%, 60%, 70%, 80%, 90%, 100%, 150%, 200%, 250%, 300%, 350% or 400%. When a plurality of features 114 is filled with the metal film 122, a plurality of pillars 132 can be formed.

In one embodiment, treating the metal film 122 comprises exposing the film to an oxidizing environment. In some embodiments, treating the metal film 122 comprises exposing the film to an oxidizing agent comprising one or more of $O_2$, $O_3$, $N_2O$, $H_2O$, $H_2O_2$, CO, $CO_2$, $NH_3$, $N_2$/Ar, $N_2$/He or $N_2$/Ar/He. In some embodiments, the oxidizing conditions comprise a thermal oxidation, plasma enhanced oxidation, remote plasma oxidation, microwave and radio-frequency (e.g., ICP, CCP).

Treating the metal film 122 can occur at any suitable temperature depending on, for example, the composition of the film and the expanding agent. In some embodiments, the film expansion occurs at a temperature in the range of about 25° C. to about 1100° C. In some embodiments, expansion occurs at a temperature greater than or equal to about 250° C., 300° C., 350° C., 400° C., 450° C., 500° C. or 550° C. In some embodiments, treating the metal film 122 occurs at a temperature less than or equal to about 450° C., or 400° C., or 350° C., or 300° C., or 250° C. or 200° C. In some embodiments, the metal film 122 comprises tungsten and is formed at a temperature in the range of about 150° C. to about 200° C.

As shown in FIG. 1D, during expansion, the fidelity of the feature shape is maintained so that the pillars 132 grow straight up from the feature 114. As used in this regard, "straight up" means that the sides of the pillars 132 are substantially coplanar with the sidewall of the feature 114. A surface is coplanar with the sidewall where the angle formed at the junction of the sidewall 214 and the surface is ±10°. In this regard, an expanded film which extends "straight up" from the feature may be described as orthogonal to the top surface of the substrate if the sidewalls are perpendicular to the top surface.

The reaction which converts metal film 122 to pillars 132 can be any reaction which increases the oxidation state of the metal atoms present in the metal film 122. Suitable reactions include, but are not limited to, oxidation reactions, boronation reactions, nitridation reactions, siliciding reactions or germaniciding reactions. Those skilled in the art will understand that other processes and reactions may be used to treat metal film 122 to form pillars 132.

In some embodiments, the metal film 122 is expanded by exposure to an oxidizing agent or oxidizing conditions. The oxidizing agent can be any suitable oxidizing agent including, but not limited to, $O_2$, $O_3$, $N_2O$, $H_2O$, $H_2O_2$, CO, $CO_2$, $NH_3$, $N_2$/Ar, $N_2$/He, $N_2$/Ar/He and combinations thereof. In some embodiments, the oxidizing conditions comprise a thermal oxidation, plasma enhanced oxidation, remote plasma oxidation, microwave and radio-frequency (e.g., ICP, CCP).

In some embodiments, the metal film 122 is expanded by exposure to a nitridation agent or nitridation conditions to convert the metal to a metal nitride film. The nitridation agent can be any suitable nitridation agent including, but not limited to, ammonia, hydrazine, $NO_2$, $N_2$/Ar plasma, $N_2$/He plasma, $N_2$/Ar/He plasma and combinations thereof. In some embodiments, the nitridation conditions comprise a thermal nitridation, plasma enhanced nitridation, remote plasma nitridation, microwave and radio-frequency (e.g., ICP, CCP).

In some embodiments, the metal film 122 is expanded by exposure to a siliciding agent or siliciding conditions to convert the metal to a metal silicide film. The siliciding agent can be any suitable siliciding agent including, but not limited to, silane, disilane, trisilane, tetrasilane, pentasilane, hexasilane, trimethyl silane, compounds with trimethylsilyl substituents and combinations thereof. In some embodiments, the siliciding conditions comprise a thermal siliciding, plasma enhanced siliciding, remote plasma siliciding, microwave and radio-frequency (e.g., ICP, CCP).

In some embodiments, the metal film 122 is expanded by exposure to a germanium agent or germaniciding conditions to convert the metal to a metal germanicide film. The germaniciding agent can be any suitable germaniciding agent including, but not limited to, germane, digermane, trigermane, tetragermane, pentagermane, hexagermane, trimethyl germanium, compounds with trimethylgermanyl substituents and combinations thereof. In some embodiments, the germaniciding conditions comprise a thermal germaniciding, plasma enhanced germaniciding, remote plasma germaniciding, microwave and radio-frequency (e.g., ICP, CCP).

In some embodiments, the metal film 122 comprises tungsten and the pillar 132 comprises tungsten oxide (WOx). In some embodiments, the metal film 122 consists essentially of tungsten and the pillar 132 consists essentially of tungsten oxide. As used in this manner, the term "consists essentially of" means that the subject film or pillar is greater than or equal to about 95%, 98% or 99% of the stated element(s), on an atomic basis. For example, a pillar consisting essentially of tungsten oxide has tungsten and oxygen atoms in a combined amount that is greater than or equal to about 95% of the atomic composition of the pillar.

Figure 1E:
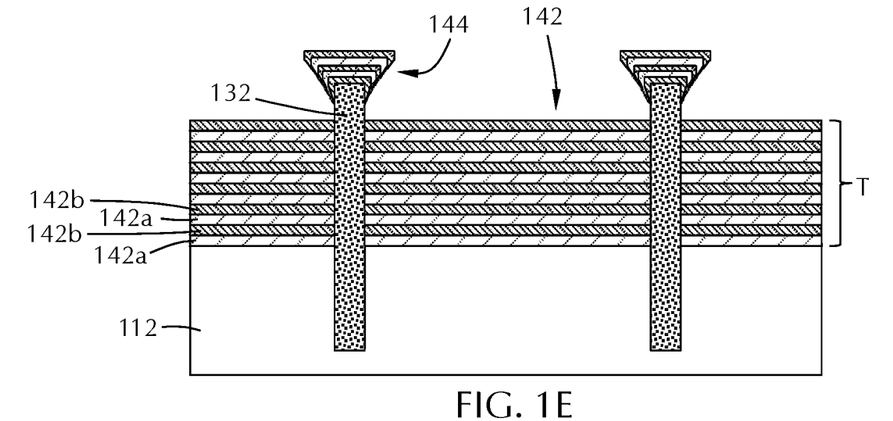

At process 150, as shown in FIG. 1E, a blanket film 142 is deposited to a thickness T that is less than the height H of the pillars 132. The height H of the pillars 132 is measured from the surface 113 of the substrate 112 (or the top layer of blanket film as shown in FIG. 1J). In some embodiments, the blanket film 142 is formed by a non-conformal deposition process (e.g., plasma-enhanced chemical vapor deposition). During formation of the blanket film 142, an amount of blanket film 144 is formed or deposited on the top of the pillars 132.

The blanket film 142 can be a homogenous material or a combination of materials deposited in a laminate. In some embodiments, as shown in FIG. 1E, the blanket film 142 comprises a plurality of alternating layers 142a, 142b. The alternating layers 142a, 142b can be any suitable materials including, but not limited to, metallic layers, nitride layers or oxide layers. In some embodiments, the blanket film 142 comprises alternating oxide layers and one or more of metallic or nitride layers. In some embodiments, the blanket film 142 comprises alternating oxide layers and nitride layers.

The thickness of the alternating layers 142a, 142b can be any suitable thickness and can be the same for each layer or different. In some embodiments, each of the alternating layers 142a, 142b are approximately the same thickness. The number of layers can vary depending on, for example, the height H of the pillars 132 and the thickness of the alternating layers 142a, 142b.

Figure 1F:
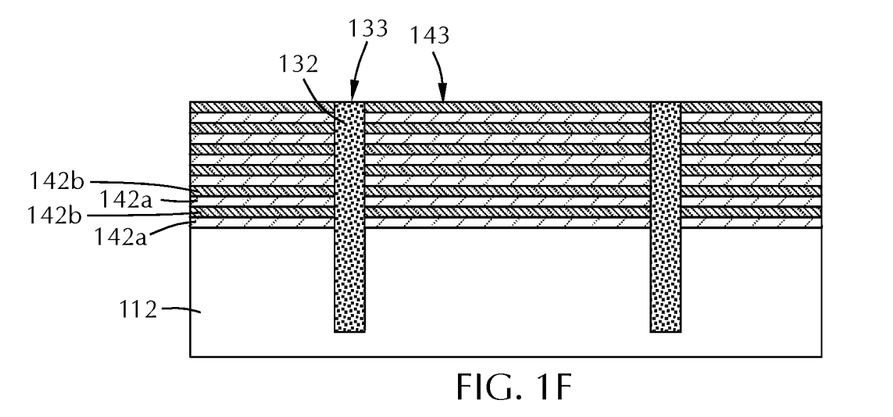

At procedure 160, as shown in FIG. 1F, the blanket film 144 at the top of the pillars 132 are removed. Removing the blanket film 144 at the top of the pillars 132 can be done by any suitable technique including, but not limited to, CMP or a selective dielectric etch. In some embodiments, the height H of the pillars 132 is reduced at the same time as removing the blanket film 144 from the pillars 132 so that the top 133 of the pillars 132 is equal to or lower than the top 143 of the blanket film 142.

Figure 1G:
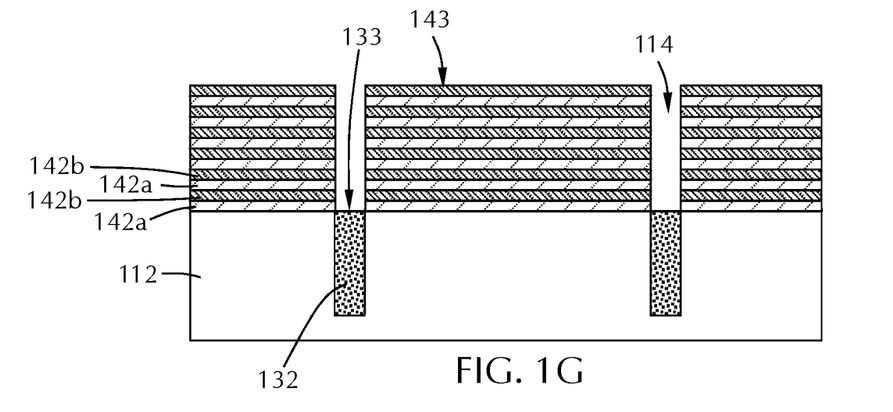

At procedure 170, as shown in FIG. 1G, the pillars 132 are recessed into the blanket film 142 so that the top 143 of the pillars 132 is below the top 143 of the blanket film 142. The height of the pillars 132 has been reduced so that the pillars 132 are lower than the thickness T of the blanket film 142. The recessed pillars 132 at least partially reform the plurality of features 114 for further processing. Those skilled in the art will understand that the features 114 partially reformed by the recessed pillars is not exactly the same features as initially provided in the structured substrate 112. Rather the features 114 partially reformed provide a somewhat equivalent physical orientation to the initial features in the blanket film 142.

The pillars 132 can be recessed by any suitable etch process. In some embodiments, etching the pillars 132 comprises exposing the pillars 132 to a metal halide compound. In some embodiments, the metal halide compound has a different metal than the pillars 132.

In some embodiments, etching the pillars 132 comprises exposure to a metal-and-halogen-containing precursor (e.g. $WCl_6$), also referred to as a metal halide precursor. The metal halide precursor can react with the pillars 132.

In some embodiments, exposure to the metal halide precursor causes an exothermic reaction with the pillar material and no plasma is present in the substrate processing region. No plasma excites the metal-halide precursor prior to entering the substrate processing region according to one or more embodiments.

In an exemplary non-limiting process, the pillars comprise tungsten and grown by reaction with oxygen to form the tungsten oxide pillars, which may take the form of $WO_3$. Exposure of $WO_3$ to $WCl_6$ (or possibly $WCl_5$) forms volatile $WOCl_4$ and/or $WO_2Cl_2$ which leaves the surface until a predetermined amount or all tungsten oxide is removed. The reaction can spontaneously stop once the tungsten oxide portion (or metal oxide portion in general) is removed. The process can be repeated an integral number of cycles. Each cycle may remove a selectable amount of the original tungsten film (e.g. 1 or 2 monolayers).

In some embodiments, the metal halide precursor includes two or more or only two different elements including a metal element and a halogen element. The metal halide precursor may include only a single atom of the metal element but multiple atoms of the same halogen element (as is the case for $WCl_6$ and $WCl_5$). The metal element of the metal halide may include one or more of titanium, hafnium, zirconium, vanadium, niobium, tantalum, chromium, molybdenum, tungsten, manganese, rhenium, technetium, iron, aluminum and gallium in embodiments. In some embodiments, the metal element of the metal halide has an atomic number of 22, 23, 24, 40, 41, 42, 72, 73 or 74. In one or more embodiments, the metal element comprises an element of group 4, group 5 or group 6 of the periodic table or may be transition metals. The halogen element may be one of F and Cl according to one or more embodiments. The halogen element may be one or more of F, Cl, Br and/or I. In some embodiments, the metal-and-halogen-containing precursor fluorine-free. Some examples of suitable metal halide precursors include, but are not limited to, vanadium pentahalides, tantalum pentahalides, chromium hexahalides, molybdenum pentahalides, molybdenum hexahalides, niobium pentahalides, tungsten pentahalides, tungsten hexahalides, and manganese tetrahalides. In some embodiments, the metal halide precursors include, but are not limited to, vanadium halides, tantalum halides, chromium halides, molybdenum halides, niobium halides, tungsten halides and/ or manganese halides, where the oxidation state of the metal element can be any suitable oxidation state.

The etch processes of some embodiments has a selectivity greater than or equal to about 10:1, greater than or equal to about 15:1, greater than or equal to about 20:1 or greater than or equal to about 25:1.

In some embodiments, there is little or no local plasma used in the etch process to make etch processes more selective, delicate and isotropic. The term "plasma-free" will be used herein to describe the substrate processing region during application of no or essentially no plasma power to the substrate processing region. The etchants (the metal-and-halogen-containing precursor) described possess energetically favorable etch reaction pathways which enable the substrate processing region to be plasma-free during operations of etching metal-containing materials herein. Stated another way, the electron temperature in the substrate processing region may be less than 0.5 eV, less than 0.45 eV, less than 0.4 eV, or less than 0.35 eV according to one or more embodiments. Moreover, the metal-and-halogen-containing precursor may have not been excited in any remote plasma prior to entering the substrate processing region in embodiments. For example, if a remote plasma region or a separate chamber region is present and used to conduct the halogen-containing precursor toward the substrate processing region, the separate chamber region or remote plasma region may be plasma-free as defined herein.

Figure 1H:
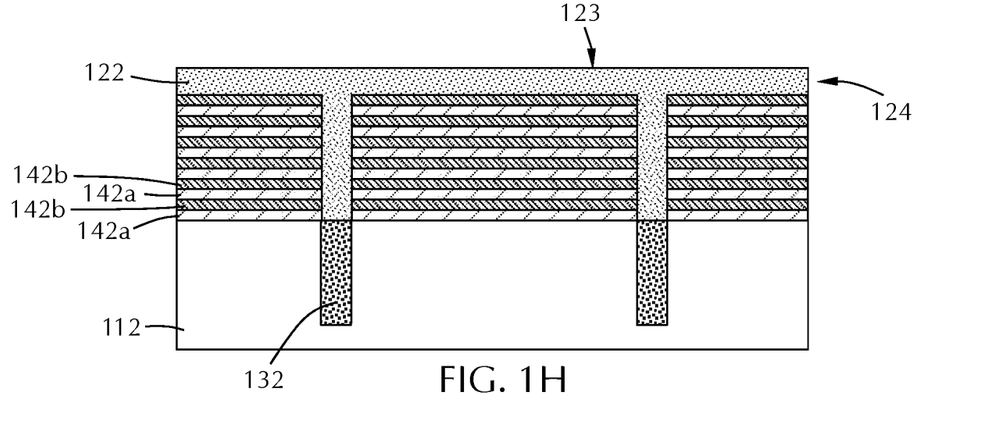
Figure 1I:
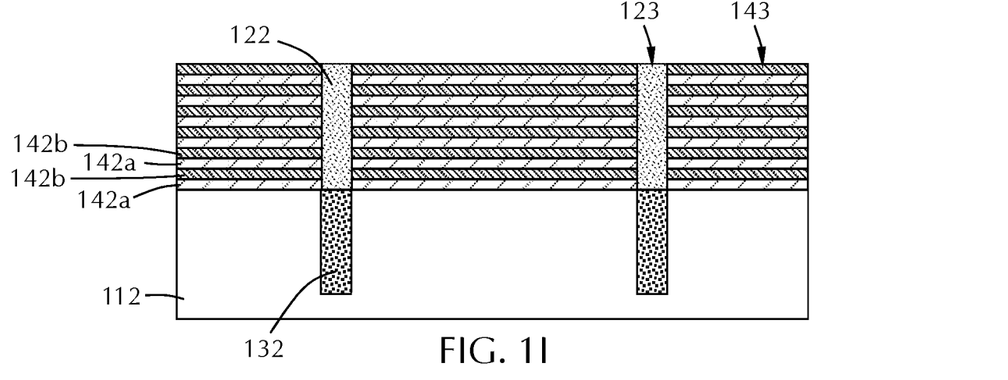
Figure 1J:
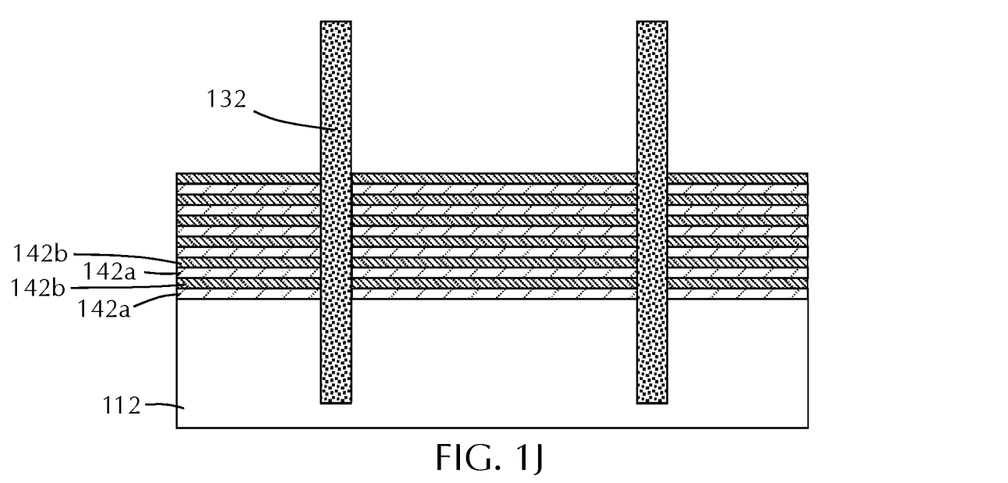
Figure 1K:
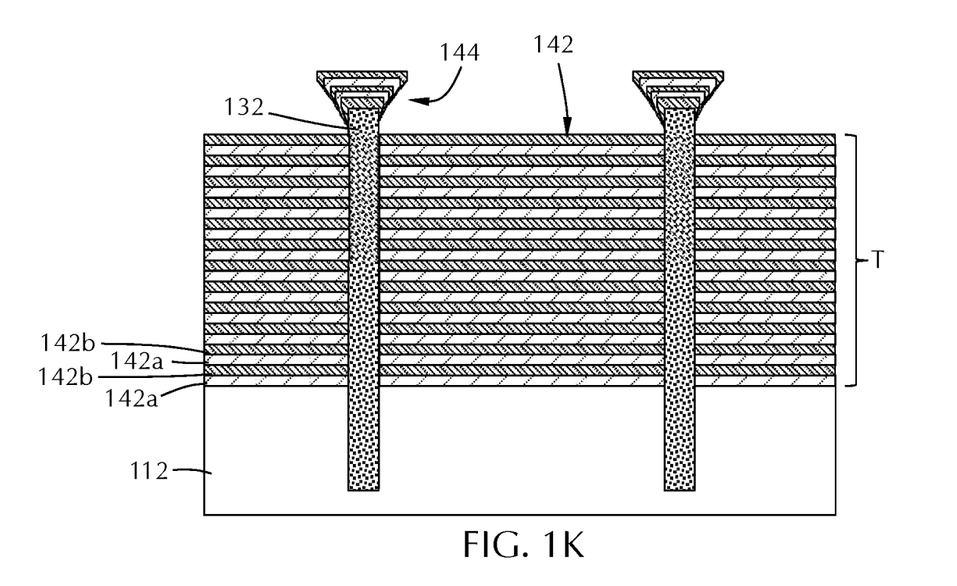
Figure 1L:
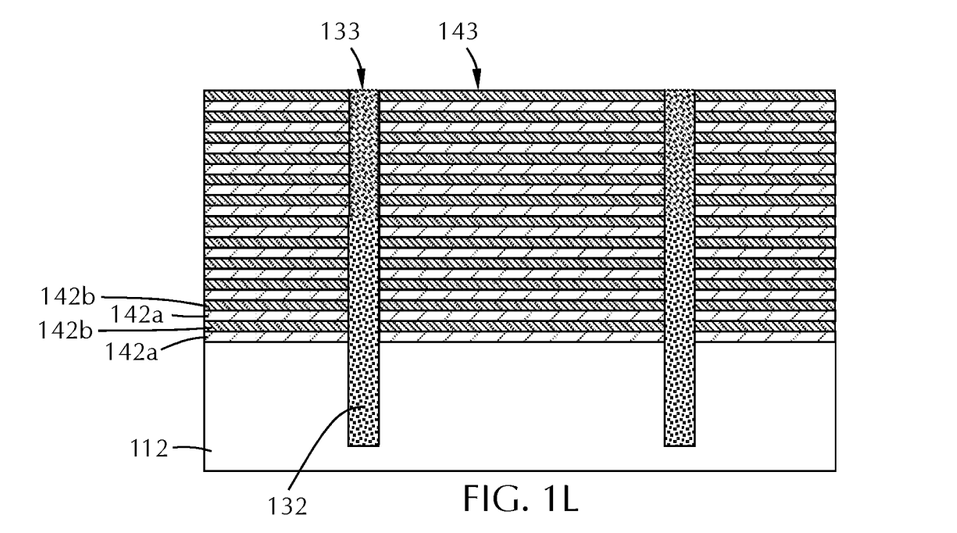

At decision 180, a determination can be made to evaluate whether additional layers of blanket film 142 are to be deposited to increase the aspect ratio of the hole. If additional cycles are to be processed, the method 100 repeats procedures 120 through 170, as illustrated in FIGS. 1H though 1L. If no further blanket film 142 is to be deposited, the method 100 moves to procedure 190.

Figure 1M:
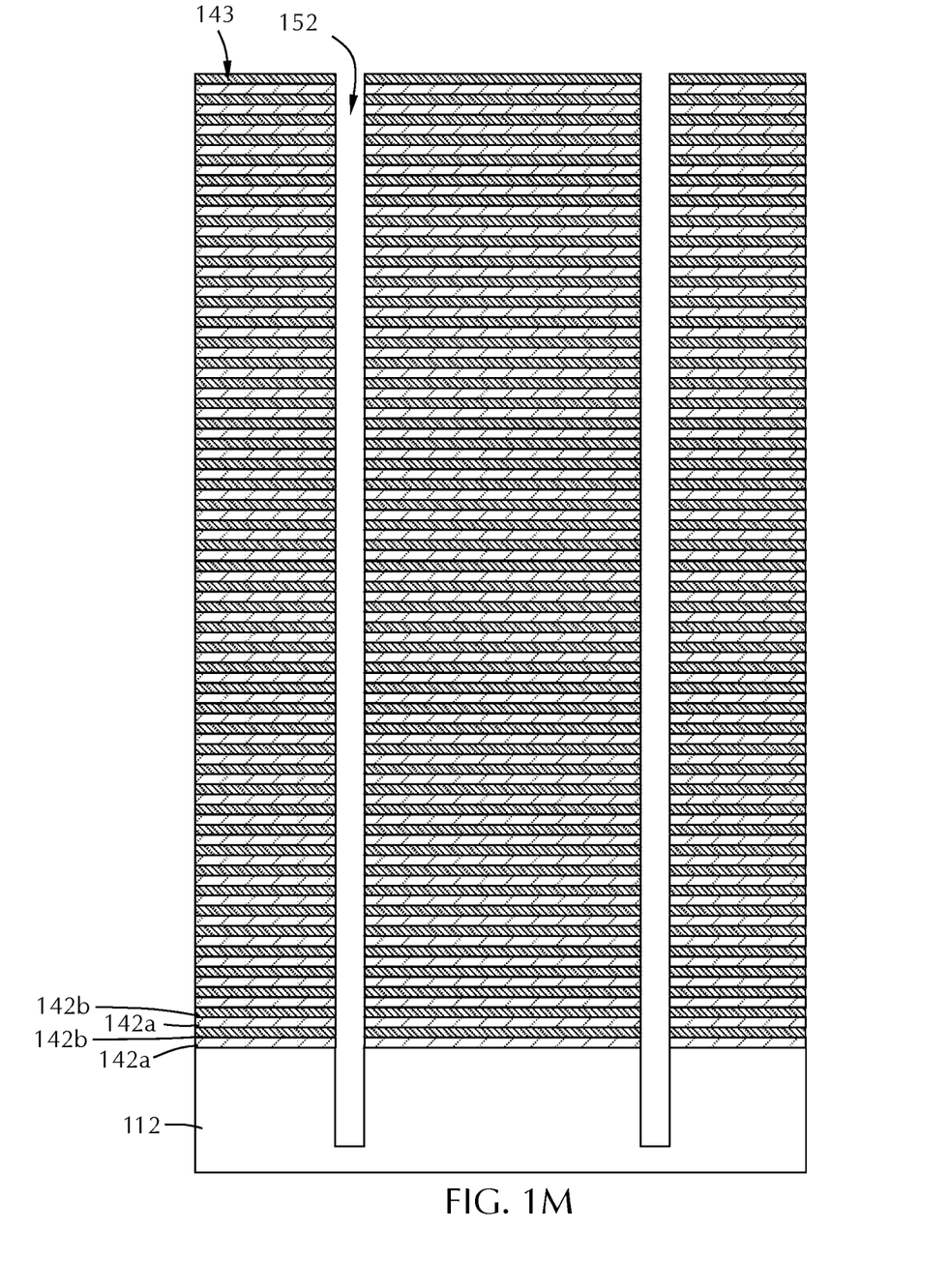

At procedure 190, as shown in FIG. 1M, the pillars 132 are completely removed from the structured substrate 112. Removal of the pillars 132 forms a hole 152 through the blanket film 142 with a high aspect ratio. The pillars 132 can be removed by any suitable technique. For example, the pillars 132 of some embodiments are removed by exposure to a metal halide etchant, similar to the recessing of the pillars 132. In some embodiments, removing all of the pillars 132 from the features 114 of the structured substrate 112 comprises exposing the pillars 132 to a metal halide etchant to selectively remove the pillars 132 without substantially affecting the blanket film 142 or the substrate 112.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming memory structures, the method comprising:
depositing a metal film in a plurality of features of a structured substrate, the plurality of features extend into the substrate a depth from a surface of the substrate;
volumetrically expanding the metal film to form pillars that extends straight out of the feature:
depositing a blanket film to a thickness less than a height of the pillars, the blanket film forming on a top of the pillars;
removing the blanket film from the top of the pillars;
reducing the height of the pillars to be lower than the thickness of the blanket film so that the plurality of features are at least partially reformed;
optionally repeating depositing the metal film, forming pillars, depositing the blanket film, removing the blanket film from the top of the pillars and reducing the height of the pillars to grow a structure of a predetermined height; and
removing all of the pillars from the features of the structured substrate.

2. The method of claim 1, wherein depositing the metal film in the features comprises forming a conformal metal film in the features and on the substrate surface and removing the metal film from the substrate surface.

3. The method of claim 2, wherein removing the metal film from the substrate surface comprises one or more of chemical-mechanical planarization (CMP) or metal selective etching.

4. The method of claim 1, wherein volumetrically expanding the metal film comprises one or more of oxidizing or nitriding the metal film.

5. The method of claim 4, wherein the metal film comprises tungsten and the pillars comprise tungsten oxide.

6. The method of claim 1, wherein the blanket film comprises a plurality of alternating layers.

7. The method of claim 6, wherein the alternating layers comprise oxide layers and metal layers or nitride layers.

8. The method of claim 6, wherein the blanket film is deposited by a non-conformal deposition.

9. The method of claim 1, wherein removing the blanket film from the top of the pillars comprises one or more of chemical-mechanical planarization (CMP) or a selective etching process.

10. The method of claim 9, wherein the height of the pillars is reduced at the same time as removing the blanket film from the top of the pillars.

11. The method of claim 1, wherein reducing the height of the pillars comprises exposing the pillars to an etchant.

12. The method of claim 11, wherein the etchant comprises a metal halide.

13. The method of claim 1, wherein removing all of the pillars from the features of the structured substrate comprises exposing the pillars to a metal halide etchant to selectively remove the pillars without substantially affecting the blanket film or the substrate.

14. A method of forming memory structures, the method comprising:
providing a structured substrate having a surface with a plurality of features formed therein, the features extending a depth from the surface of the substrate;

depositing a conformal metal film in the features of the structured substrate and forming an overburden on the surface of the structured substrate;

removing the overburden from the surface of the substrate so that the metal film remains substantially only within the features;

oxidizing the metal film in the features of the substrate to form pillars that extends straight out of the features, the pillars having a height and a top;

depositing a blanket film comprising alternating oxide layers and nitride layers, the blanket film deposited to a thickness less than the height of the pillars, the blanket film forming on a top of the pillars;

removing the blanket film from the top of the pillars;

reducing the height of the pillars to be lower than the thickness of the blanket film so that the top of the pillar is below the surface of the blanket film and at least partially reforming the features;

optionally repeating depositing the metal film, forming pillars, depositing the blanket film, removing the blanket film from the top of the pillars and reducing the height of the pillars to grow a structure of a predetermined height; and removing all of the pillars from the features of the structured substrate.

15. A method of forming memory structures, the method comprising:
(a) providing a structured substrate having a surface with a plurality of features formed therein, the features extending a depth from the surface of the substrate;
(b) depositing a conformal metal film in the features of the structured substrate and forming an overburden on the surface of the structured substrate;
(c) removing the overburden from the surface of the substrate so that the metal film remains substantially only within the features;
(d) oxidizing the metal film in the features of the substrate to form pillars that extends straight out of the features, the pillars having a height and a top;
(e) depositing a blanket film comprising alternating oxide layers and nitride layers, the blanket film deposited to a thickness less than the height of the pillars, the blanket film forming on a top of the pillars;
(f) removing the blanket film from the top of the pillars;
(g) reducing the height of the pillars to be lower than the thickness of the blanket film so that the top of the pillar is below the surface of the blanket film and at least partially reforming the features;
(h) optionally repeating (b) through (g) to grow a structureof a predetermined height; and
removing all of the pillars from the features of the structured substrate.

16. The method of claim 14, wherein removing the overburden of the metal film from the substrate surface comprises one or more of chemical-mechanical planarization (CMP) or metal selective etching.

17. The method of claim 14, wherein the metal film comprises tungsten and the pillars comprise tungsten oxide.

18. The method of claim 14, wherein removing the blanket film from the top of the pillars comprises one or more of chemical-mechanical planarization (CMP) or a selective etching process.

19. The method of claim 14, wherein reducing the height of the pillars comprises exposing the pillars to an etchant.

20. The method of claim 19, wherein the etchant comprises a metal halide.

* * * * *

UNITED STATES PATENT AND TRADEMARK OFFICE
CERTIFICATE OF CORRECTION

PATENT NO. : 11,315,943 B2
APPLICATION NO. : 16/643965
DATED : April 26, 2022
INVENTOR(S) : Praburam Gopalraja et al.

It is certified that error appears in the above-identified patent and that said Letters Patent is hereby corrected as shown below:

In the Specification

• Column 2, Line 39, after "the", and before "metal", remove "method".

In the Claims

• Column 12, Claim 15, Line 16 and 17, after "grow a", replace "structureof" with "structure of".

Signed and Sealed this
Fourteenth Day of June, 2022

Katherine Kelly Vidal
*Director of the United States Patent and Trademark Office*